United States Patent

Iwasaki et al.

[11] Patent Number: 5,706,576
[45] Date of Patent: Jan. 13, 1998

[54] PARTS MOUNTER CARTRIDGE STRUCTURE AND PARTS MOUNTER MANAGING SYSTEM

[75] Inventors: Hiroyuki Iwasaki; Mitsushi Sonoda, both of Tokyo; Hiroyuki Takenaka, Hidaka, all of Japan

[73] Assignee: Kabushiki Kaisha Toshiba, Japan

[21] Appl. No.: 595,083

[22] Filed: Feb. 1, 1996

Related U.S. Application Data

[62] Division of Ser. No. 227,672, Apr. 14, 1994, Pat. No. 5,515,600.

[30] Foreign Application Priority Data

Apr. 14, 1993 [JP] Japan ..................... 5-087464

[51] Int. Cl.[6] .............................................. B23P 21/00
[52] U.S. Cl. ................................. 29/703; 29/720
[58] Field of Search .................... 29/740, 741, 702, 29/703, 720; 206/330

[56] References Cited

U.S. PATENT DOCUMENTS

| | | | |
|---|---|---|---|
| 4,819,699 | 4/1989 | Brown et al. | 29/741 |
| 5,400,497 | 3/1995 | Watanabe et al. | 29/740 |

FOREIGN PATENT DOCUMENTS

| | | |
|---|---|---|
| 3232298 | 12/1991 | Japan . |
| 4179197 | 6/1992 | Japan . |
| 5335784 | 12/1993 | Japan . |

*Primary Examiner*—David P. Bryant
*Attorney, Agent, or Firm*—Cushman Darby & Cushman Intellectual Property Group of Pillsbury Madison & Sutro, LLP

[57] ABSTRACT

A lifting mechanism is arranged between a cartridge main body and a reel support member. With the cartridge main body set in a parts mounter, the lifting mechanism allows the reel support member to be supported by the cartridge main body so that the reel support member can be pivoted upward at a predetermined pivoting angle (set position PA→bar code read position PB). While cartridges are kept placed in the parts mounter, a parts supply reel attached to a given cartridge is made to project from other reels. This enables a bar code reader to read the parts code of a label adhered on one side surface of that reel.

5 Claims, 12 Drawing Sheets

SEQUENCE DATA

PARTS 1 — X , Y , θ    D 1
         (COORDINATE DATA) (DEVICE NUMBER)

PARTS 2 — ----------------------

PARTS 3 — ----------------------

FIG. 5A

DEVICE DATA

D 1   100Ω RESISTOR (PARTS CODE)

PARTS MOUNTER CARTRIDGE STRUCTURE AND PARTS MOUNTER MANAGING SYSTEM

This is a division of application Ser. No. 08/227,672, filed Apr. 14, 1994, now U.S. Pat. No. 5,515,600.

BACKGROUND OF THE INVENTION

1. Field of the Invention

The present invention relates to a parts mounter cartridge structure and a parts mounter managing system to be applied to a parts mounter in which a plurality of cartridges each having a parts supply reel are arranged parallel to each other in a line at fixed intervals, and which mounts parts fed from the cartridges on a predetermined printed circuit board.

2. Description of the Related Art

Figure 1A:
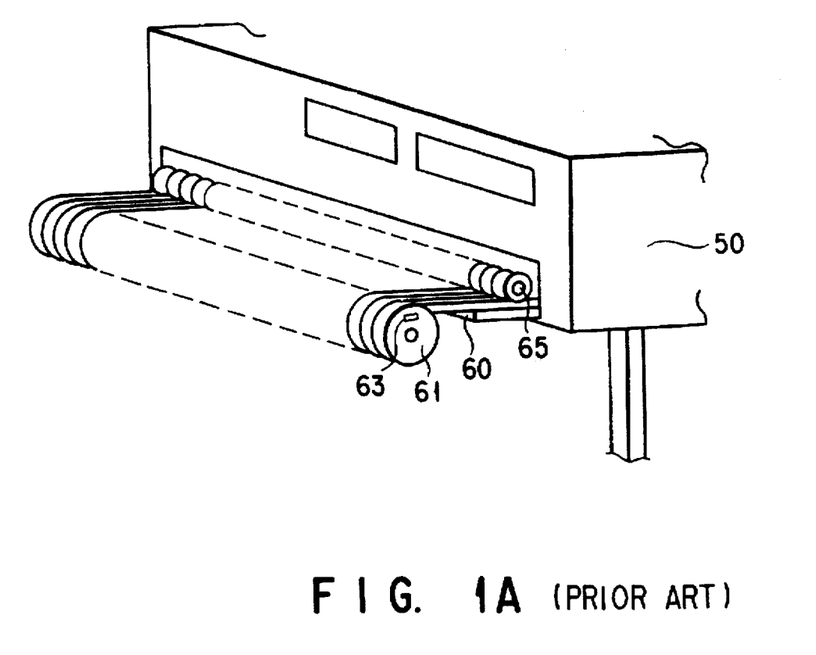
FIGS. 1A and 1B are views showing the arrangement of a parts mounter as an object of the present invention and the arrangement of a conventional cartridge, respectively.
Figure 1B:
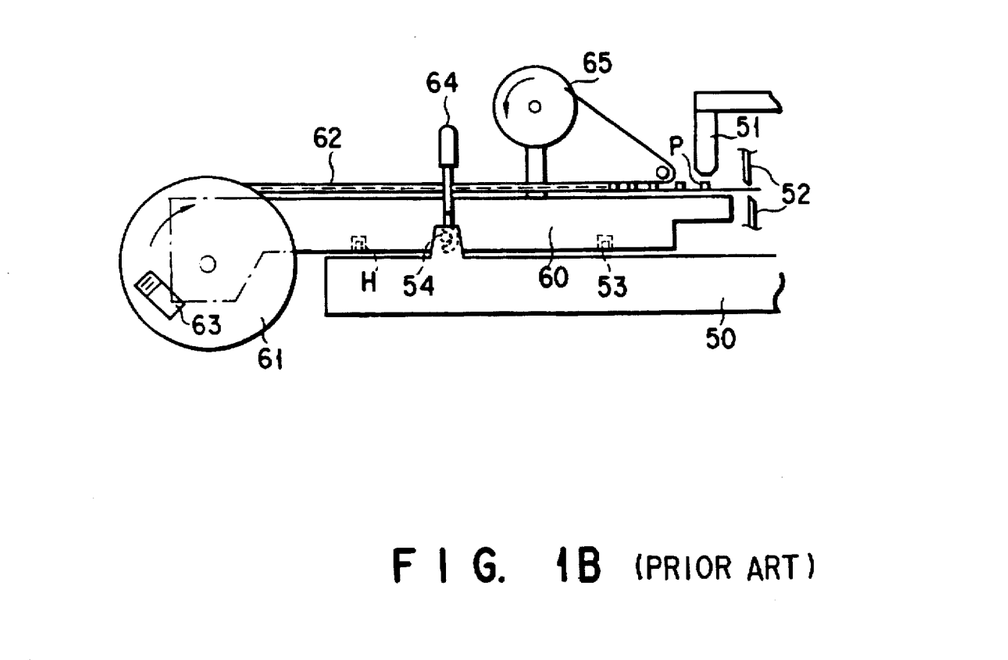

A parts mounter for automatically mounting various parts including, e.g., resistors and capacitors on the surface of a printed circuit board has an arrangement as shown in FIGS. 1A and 1B. That is, a plurality of cartridges 60 are arranged parallel to each other at narrow intervals in a parts mounter 50. Each cartridge 60 has a parts supply reel 61 on which a tape-like parts holding medium (parts mounting tape) 62 holding parts to be mounted at fixed intervals is wound. In this arrangement, a parts information label 63 representing the parts code of parts to be supplied as a bar code is adhered on one side surface of each parts supply reel 61. This parts information label 63 is used in a setup check (which is performed, when the type of product flowed on a line is changed, in order to set cartridges in accordance with the change), in a check performed when the reels are changed, and in a variety of management tasks.

Referring to FIG. 1B, reference numeral 51 denotes a parts chuck nozzle provided in the parts mounter 50. The parts chuck nozzle 51 holds one part P by vacuum suction, which is fed from the parts mounting tape 62 wound on the parts supply reel 61, transfers the part P to a mounting position on a PCB (Printed Circuit Board) as an object to be processed placed in the parts mounter, and mounts the part P on that position. Reference numeral 52 denotes a cutter which is also provided in the parts mounter 50. The cutter 52 cuts away an unnecessary bottom tape from the parts mounting tape 62. Reference numeral 53 denotes a cartridge positioning pin of the parts mounter 50. The cartridge positioning pin 53 fits in a fixing hole H for positioning formed in the cartridge 60 and thereby fixes the cartridge 60 at a predetermined position of the parts mounter 50. Reference numeral 54 denotes a lock pin of the parts mounter 50. The lock pin 54 engages with the lock claw of a lock lever 64 of the cartridge 60 and thereby fixes the cartridge 60 at a predetermined position of the parts mounter 50. Reference numeral 65 denotes a take-up reel for taking up an unnecessary top film from the parts mounting tape 62.

The parts mounter 50 with the above arrangement requires a task of comparing the parts code of the label 63 adhered on the parts supply reel 61 of each cartridge 60 set in the parts mounter 50 with device assignment data (parts list) for computer management.

In the above arrangement, however, the cartridges 60 each having the parts supply reel 61 are juxtaposed at narrow intervals in the parts mounter 50. Consequently, it is impossible to mechanically read the parts code of the label 63 adhered on each parts supply reel 61 with the cartridges 60 kept placed in the parts mounter 50.

Conventionally, therefore, an operator A visually reads the code recorded on the parts information label 63 adhered on the side surface of the parts supply reel 61 and verbally transmits the read code to another operator B; and the operator B confirms the code on a parts list. That is, the parts confirmation work performed by a plurality of operators is required for all of the parts supply reels.

This conventional parts confirming means, however, requires a plurality of operators in the parts confirmation task. In addition, it is necessary to read the codes recorded on the labels on the side surfaces of the reels while the reels are kept juxtaposed at narrow intervals, i.e., with no large spacings between them. For these reasons, no highly reliable and stable parts confirmation work can be expected, resulting in a high ratio of occurrence of parts mounting errors. Also, the confirmation work is time-consuming and requires much labor.

SUMMARY OF THE INVENTION

It is an object of the present invention to provide a parts mounter cartridge structure by which it is possible to mechanically read the parts code of a parts supply reel attached to a cartridge with the cartridge placed in a parts mounter in which a plurality of cartridges each having parts supply reel are arranged parallel to each other at narrow intervals.

It is another object of the present invention to provide a parts mounter managing system capable of smoothly and rapidly performing a parts comparing work with a high reliability while cartridges are kept placed in a parts mounter.

Figure 2:
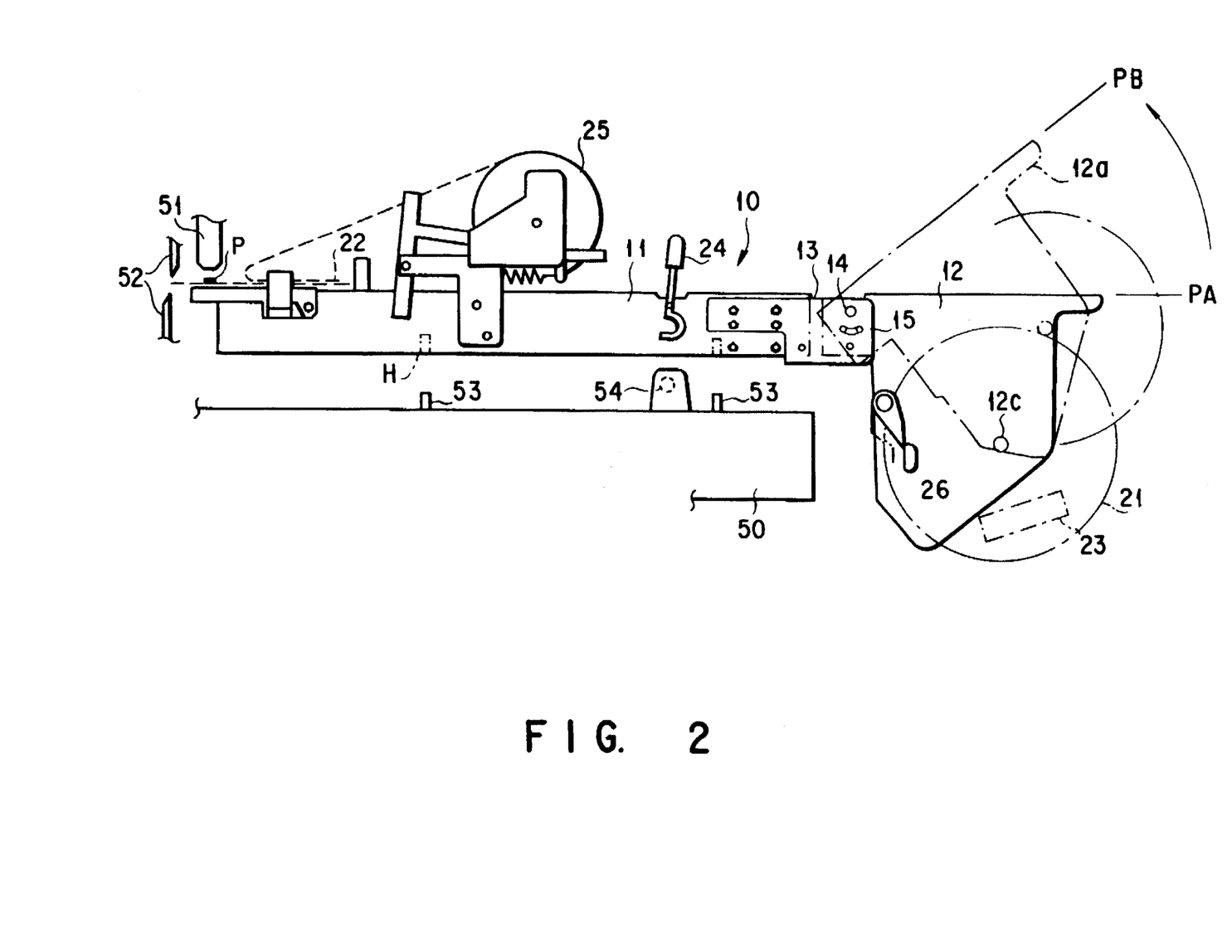
FIG. 2 is a view for explaining a parts mounter cartridge structure according to one embodiment of the present invention.

According to the present invention, as shown in FIG. 2, in a parts mounter in which a plurality of cartridges each having a parts supply reel are arranged parallel to each other, each cartridge 10 comprises a cartridge main body 11 not including a reel support member, a reel support member 12 having a portion for attaching a parts supply reel 21, and a lifting mechanism 13 which allows the reel support member 12 to be supported by the cartridge main body 11 such that the reel support member 12 is pivoted upward at a predetermined pivoting angle (set position PA→bar code read position PB), with the cartridge main body 11 set in the parts mounter 50. With this arrangement, while the cartridges 10 are kept placed in the parts mounter 50, the parts supply reel 21 attached to a given cartridge can be manually projected from other reels. This allows a bar code reader to read the parts code of a label adhered on one side surface of that reel.

In addition, the present invention has an arrangement comprising storage means for storing parts constitution information provided by a host system, a reader for reading the bar code of a label adhered on a parts supply reel projected by the above-mentioned reel lifting mechanism, checking means for checking parts to be mounted by comparing the parts information read by the reader with the parts constitution information stored in the storage means, and output means for outputting the check result. This arrangement enables a single operator to smoothly and rapidly execute a highly reliable parts confirmation work of comparing the parts code of the label adhered on the parts supply reel of each cartridge set in the parts mounter with device assignment data (parts list) for computer management.

According to the present invention, in a parts mounter in which a plurality of cartridges each having a parts supply reel are arranged parallel to each other at narrow intervals, the parts code of a label adhered on one side surface of each reel can be mechanically read by using a bar code reader or the like with the cartridges set in the parts mounter. This makes it possible to rapidly and reliably perform the parts code reading work for each reel.

Also, according to the present invention, a single operator can smoothly and rapidly perform a highly reliable parts confirmation work of comparing the parts code of a label adhered on the parts supply reel of each cartridge set in the parts mounter with the device assignment data (parts list) for computer management.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 13A and 13B illustrate perspective views of the cartridge structure shown in FIG. 2 in which FIG. 13A shows that the reel support member 12 is at the set position PA and FIG. 13B shows that the rebel support member 12 is at the bar code read position PB.

DETAILED DESCRIPTION OF THE PREFERRED EMBODIMENTS

One embodiment of the present invention will be described below with reference to the accompanying drawings.

Figure 3:
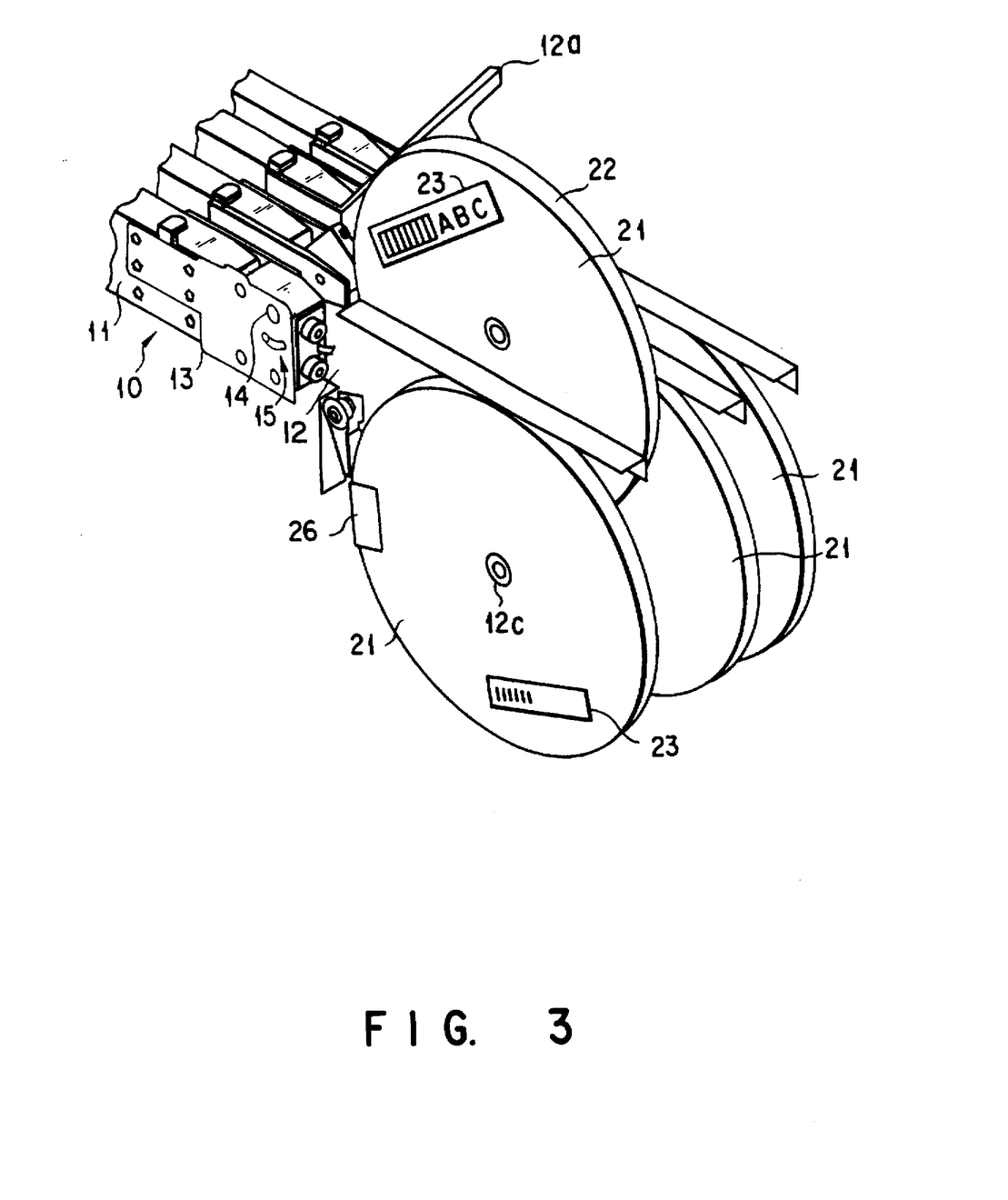
FIG. 3 is a view for explaining a reel lifting structure of the cartridge shown in FIG. 2.

FIG. 2 is a view for explaining a parts mounter cartridge structure according to one embodiment of the present invention. FIG. 3 is a view for explaining a reel lifting mechanism of the cartridge shown in FIG. 2.

Figure 13A:
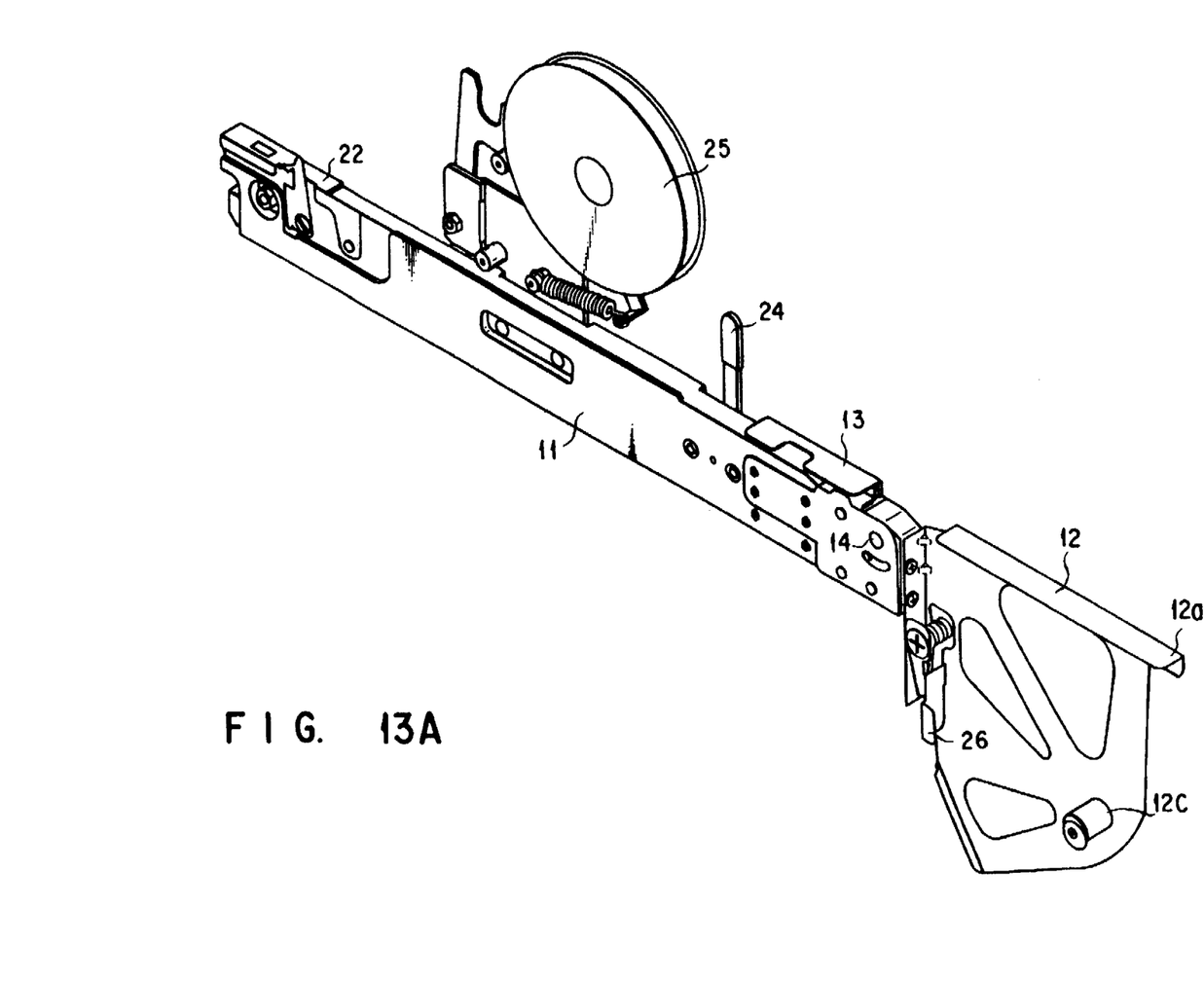
Figure 13B:
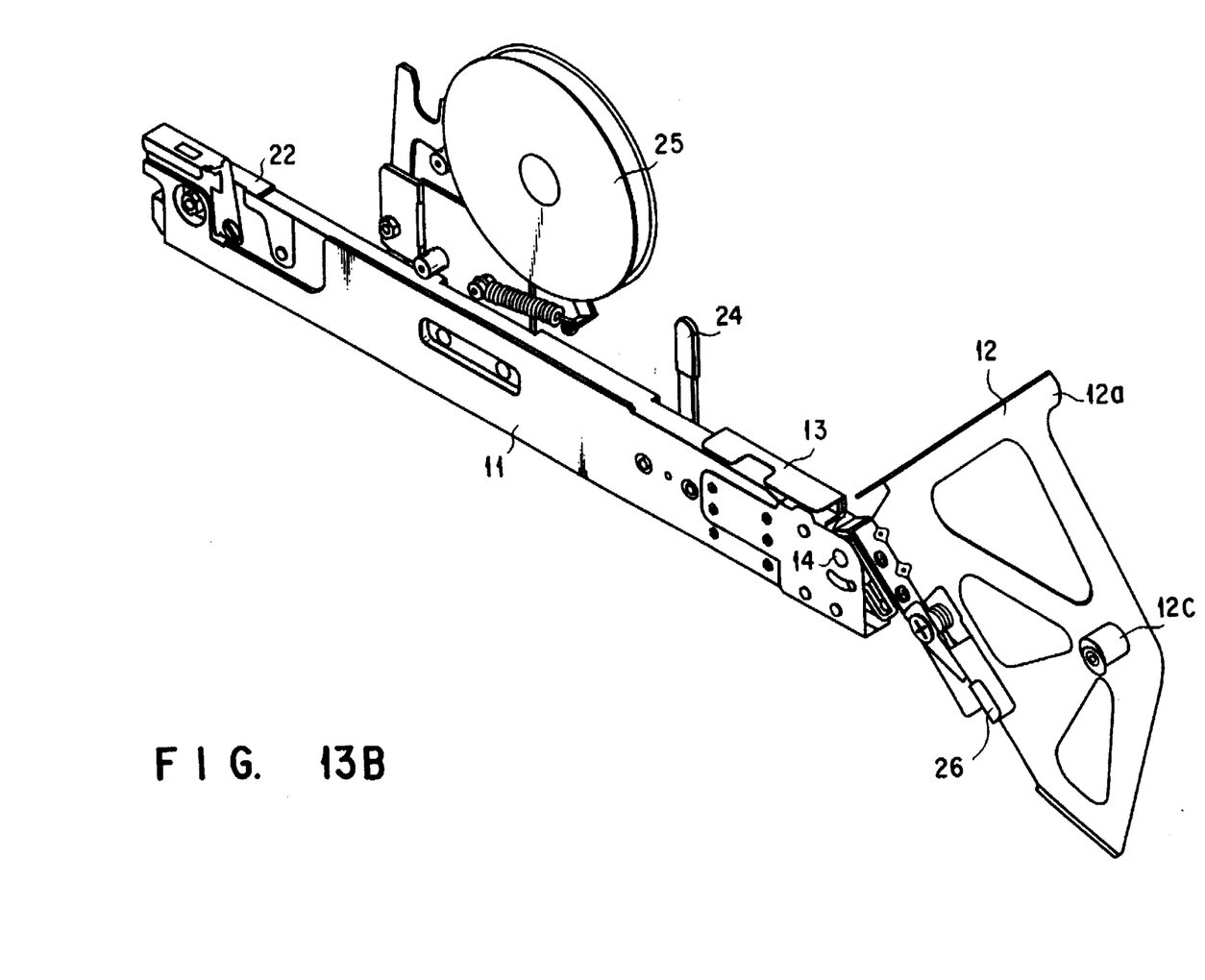

FIGS. 13A and 13B are perspective views of the cartridge structure shown in FIG. 2 in which FIG. 13A shows that the reel support member 12 is at the set position PA and FIG. 13B shows that the reel support member 12 is at the bar code read position PB.

Referring to FIGS. 2, 3, and 13, reference numeral 10 denotes a cartridge with a reel lifting mechanism. The cartridge 10 comprises a cartridge main body 11 not including a reel support member, a reel support member 12 having a portion for attaching a parts supply reel 21, and a lifting mechanism 13. The lifting mechanism 13 allows the reel support member 12 to be supported by the cartridge main body 11 such that the reel support member 12 is pivoted upward at a predetermined pivoting angle (set position PA→bar code read position PB) with the cartridge main body 11 set in a parts mounter 50.

The lifting mechanism 13 is a member for connecting the cartridge main body 11 with the reel support member 12. The lifting mechanism 13 supports the reel support member 12 to be pivotal between the two positions (PA-PB) described above by using a shaft 14 for pivotally supporting the reel support member 12 and a positioning mechanism 15 for fixing the reel support member 12 at the set position PA or the bar code read position PB.

The cartridge main body 11 has a lock lever 24, a take-up reel 25, and a fixing hole H for positioning. The lock lever 24 has a lock claw for engaging with a lock pin 54 provided in the parts mounter 50. The takeup reel 25 takes up an unnecessary top film from a parts mounting tape 22 fed from the parts supply reel 21. A cartridge positioning pin 53 provided in the parts mounter 50 fits in the fixing hole H.

As discussed above, the reel support member 12 is supported by the cartridge main body 11 so as to be pivotal between the two positions (PA-PB) by the shaft 14 and the positioning mechanism 15 of the lifting mechanism 13. This reel support member 12 has, e.g., a pinching portion 12a for performing a reel lifting operation, a reel shaft 12c for rotatably supporting the parts supply reel 21, and a reel attaching guide 26 for holding the parts supply reel 21 at the reel support member 12.

The tape-like parts holding medium (parts mounting tape) 22 on which parts P, such as resistors, capacitors, and semiconductor chips, to be mounted on the surface of a printed circuit board are held at fixed intervals is wound on the parts supply reel 21 to be attached to the reel support member 12. In addition, a label 23 on which the parts code of parts to be mounted is recorded in the form of a bar code is adhered on one side surface of the parts supply reel 21.

Reference numeral 51 denotes a parts chuck nozzle provided in the parts mounter 50. The parts chuck nozzle 51 holds one part P by vacuum suction, which is fed from the parts mounting tape 22 wound on the parts supply reel 21, transfers the part P to a mounting position on a PCB (Printed Circuit Board) as an object to be processed placed in the parts mounter, and mounts the part P on that position. Reference numeral 52 denotes a cutter which is also provided in the parts mounter 50. The cutter 52 cuts away an unnecessary bottom tape from the parts mounting tape 22. Reference numeral 53 denotes the cartridge positioning pin of the parts mounter 50. The cartridge positioning pin 53 fits in the fixing hole H for positioning formed in the cartridge 10 and thereby fixes the cartridge 10 at a predetermined position of the parts mounter 50. Reference numeral 54 denotes the lock pin of the parts mounter 50. The lock pin 54 engages with the lock claw of the lock lever 24 of the cartridge 10 and thereby fixes the cartridge 10 at a predetermined position of the parts mounter 50.

Figure 4:
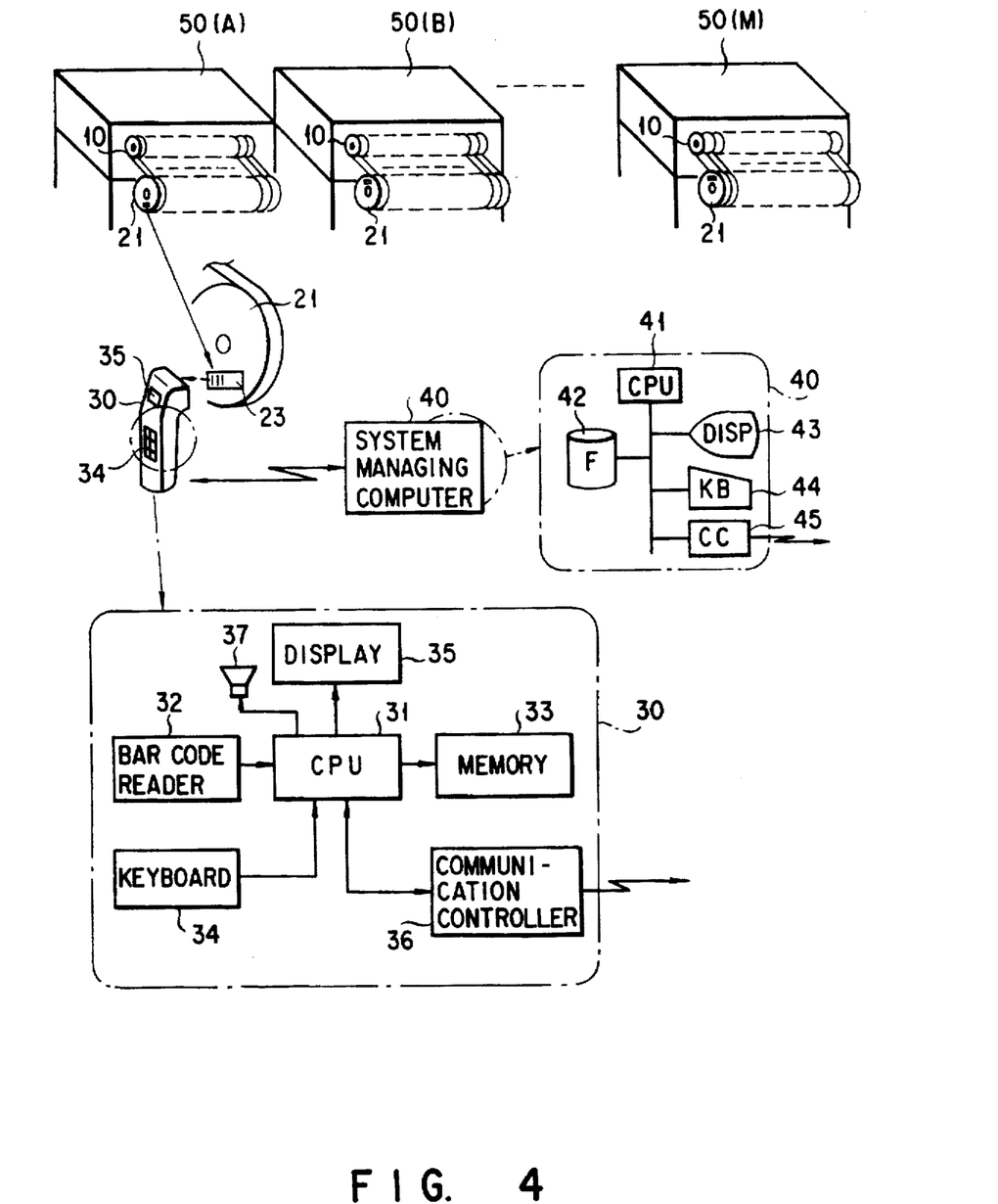
FIG. 4 is a block diagram showing the arrangement of a parts managing system for a parts mounter using the cartridge having the reel lifting mechanism according to the above embodiment.

FIG. 4 is a block diagram showing a parts managing system for the parts mounter 50 using the cartridge 10 having the reel lifting mechanism discussed above.

Referring to FIG. 4, reference numeral 30 denotes a hand-held terminal with a bar code reader for reading the bar code of the label 23 adhered on each parts supply reel 21.

The hand-held terminal 30 of this embodiment comprises, e.g., a CPU 31, a bar code reader 32, a memory 33, a keyboard 34, a display 35, a communication controller 36, and an alarm unit 37.

The CPU 31 is constituted by a one-chip microprocessor and controls the overall handy terminal. The CPU 31 has various process control functions as illustrated in FIGS. 6 through 12.

The bar code reader 32 reads the bar code of the label 23 adhered on the parts supply reel 21. That is, the bar code reader 32 reads the bar code of the parts code recorded on the label 23 adhered on the parts supply reel 21 which is lifted up by the reel lifting mechanism described above, and transfers the read data to the CPU 31.

The memory 33 consists of a RAM having a storage area and a work area, and a ROM. The storage area of the RAM stores production management information supplied from a system managing computer 40 as a host apparatus and including parts constitution information. The ROM stores control programs for realizing the various process control functions shown in FIGS. 6 through 12.

The keyboard 34 has data input keys for inputting numerical values and the like, and function keys. The keyboard 34 is provided on the housing of the handy terminal.

The display 35 is used to display information (OK/NG) concerning determination results, to display types and revisions (REV), and to display device numbers and parts codes.

The communication controller 36 exchanges various data with the host system managing computer 40. In this embodiment, the communication controller 36 is realized by a wireless serial data transmission mechanism.

The alarm unit 37 informs an operator of determination results by using audible tones (f1/f2).

The system managing computer 40 as the host apparatus of the hand-held terminal 30 comprises, e.g., a processing unit (CPU) 41 for controlling the entire system, a file (F) 42 for storing the production management information (NC data) including the parts constitution information of a variety of PCBs (Printed Circuit Boards) manufactured by the parts mounters 50(A), 50(B) . . . , and a communication control unit (CC) 45 for exchanging data with the hand-held terminal 30.

Figure 5A:
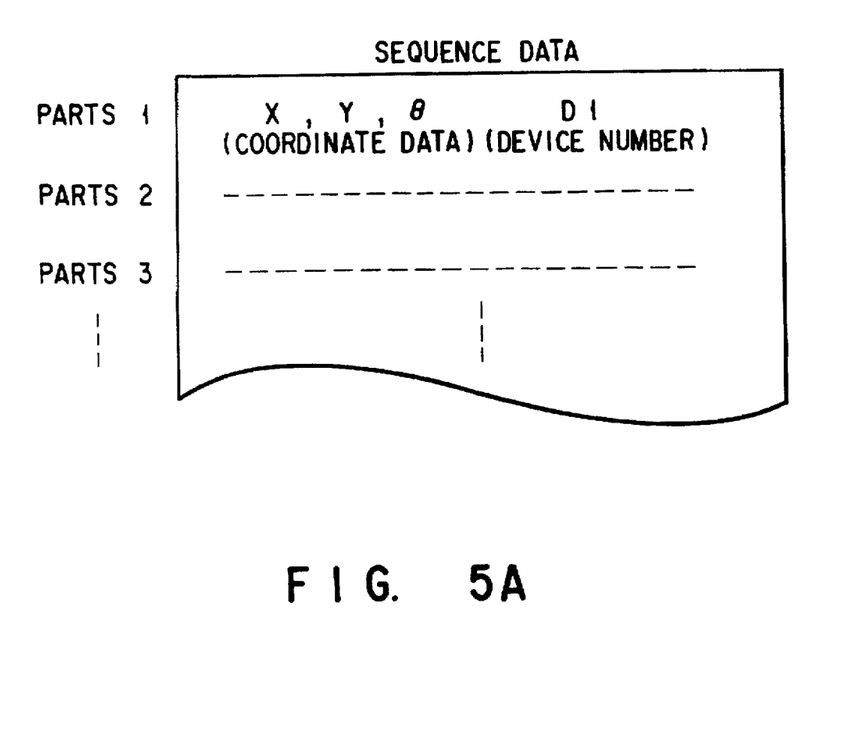
FIGS. 5A and 5B are views showing the file format of sequence data transferred from a system managing computer to each parts mounter, and the file format of parts constitution information (assignment data) transferred from the system managing computer to a handy terminal, respectively, according to the above embodiment.
Figure 5B:
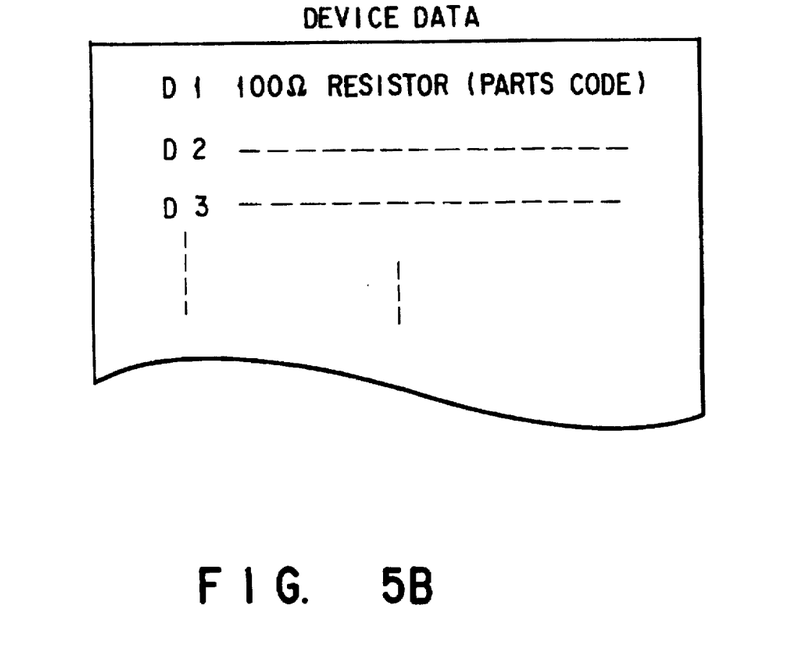

FIGS. 5A and 5B illustrate examples of the NC (Numerical Control) data that the system managing computer 40 holds. FIG. 5A shows the file format of sequence data to be transferred from the system managing computer 40 to the parts mounters 50(A), 50(B), . . . , and FIG. 5B shows the file format of parts constitution information (also called device data or assignment data) to be transferred from the system managing computer 40 to the hand-held terminal 30. This assignment data has a data structure in which device numbers (D1, D2, . . . ) indicating parts supply positions (cartridge mounting positions) of the parts mounters 50 are listed in a one-to-one correspondence with parts codes as objects to be compared with bar codes. In this embodiment, the device number D1 is a resistor of 100 kΩ, and this resistor is to be mounted at a coordinate position represented by (X,Y,θ) on a circuit board. Note that the NC data held by the system managing computer are formed in advance on the basis of CAD (Computer Aided Design) data.

Figure 6:
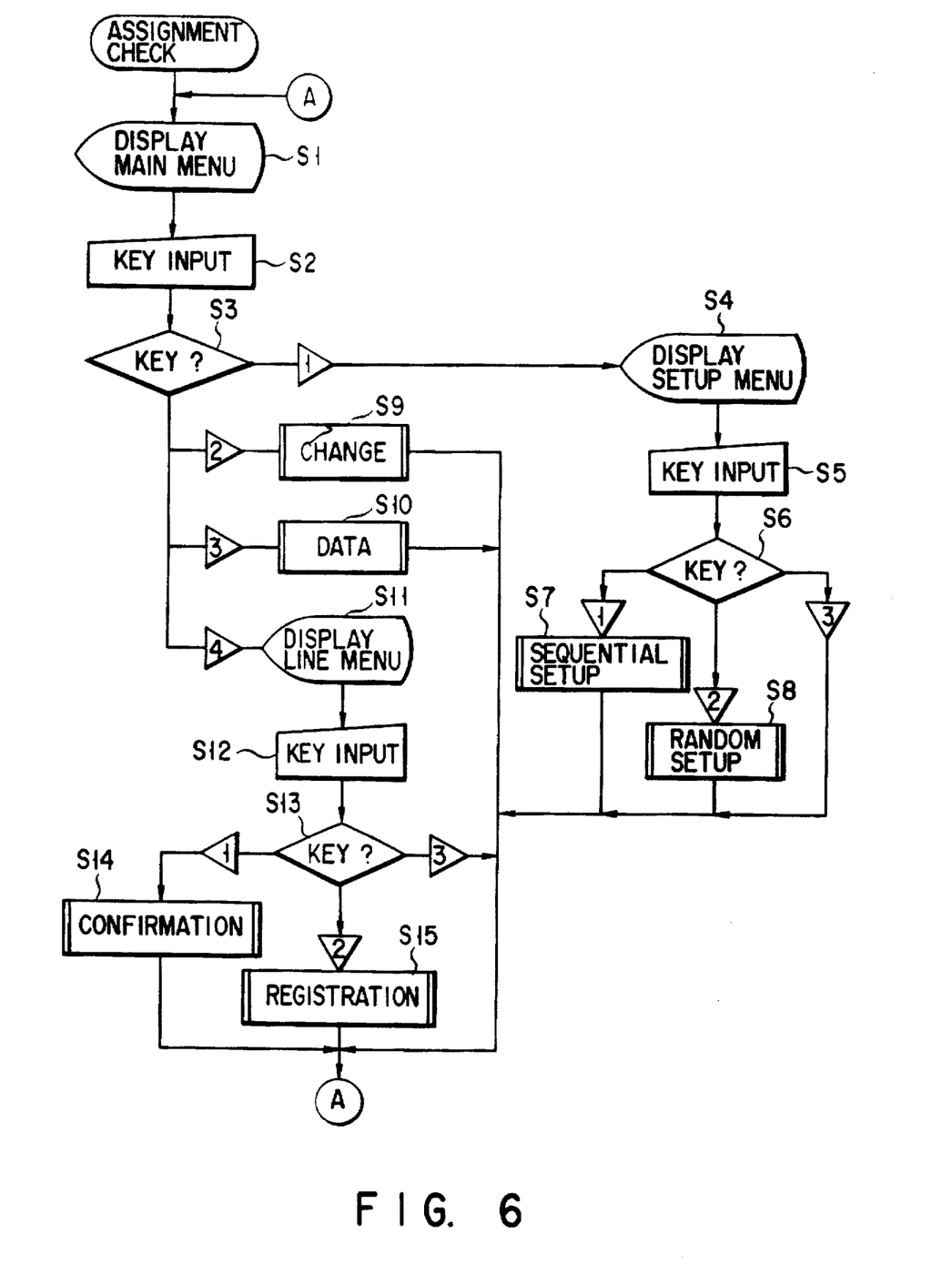
FIG. 6 is a flow chart showing the process flow of an assignment check of the above embodiment.

FIG. 6 is a flow chart showing the process flow of an assignment check performed by the hand-held terminal. Referring to FIG. 6, a main menu is first displayed on the display 35 of the hand-held terminal 30. By operating the numerical keys (1 through 4) of the keyboard 34, it is possible to choose, from this main menu, "setup (device number order/random)." (=numerical key "1"), "parts change" (reel change)" (=numerical key " device data fetch" (=numerical key "3"), and "line arrangement confirmation/change" (=numerical key "4"). Note that "line arrangement" indicates which machines (parts mounters) are linked in which order in the manufacturing line (50(A), 50(B), . . . . 50(M) in FIG. 4).

More specifically, in step S1 of FIG. 6, the CPU 31 of the hand-held terminal 30 displays the main menu on the display 35. In step S2, an operator keys in a number corresponding to the processing he or she desires from the keyboard 34; that is, the operator presses the numerical key "1", "2", "3", or "4" for the setup, the parts change, the device data fetch, or the line arrangement confirmation/change, respectively, on the keyboard 34. In step S3, the CPU 31 checks whether any of the numerical keys "1" through "4" is pressed. If the CPU 31 determines in step S3 that the key "1" is pressed, the flow advances to step S4, and the CPU displays a setup menu on the display 35. In step S5, the operator inputs "1" if he or she wishes to perform sequential setup, "2" to perform random setup, or "3" to cancel the operation. In step S6, the CPU 31 checks the numerical key pressed by the operator. If "1" is found in step S6, the CPU 31 executes the sequential setup in step S7. If "2" is found in step S6, the CPU 31 executes the random setup in step S8. If "3" is found in step S6, the CPU 31 returns the flow to step S1. Details of the sequential setup and the random setup in steps S7 and S8 will be described later with reference to FIGS. 7 and 8, respectively.

If the CPU determines in step S3 that "2" is input, the flow advances to step S9, and the CPU 31 performs the parts change. If "3" is input in step S3, the CPU 31 performs the device data fetch in step S10. If "4" is input in step S3, the CPU 31 performs the line arrangement confirmation/change in steps 11 through S15. The parts change and the device data fetch in steps S9 and S10 will be described in detail later with reference to FIGS. 9 and 10, respectively. In step S11 of the line arrangement confirmation/change, the CPU 31 displays a line menu for the line arrangement confirmation/ change on the display 35. In step S12, the operator keys in "1" to perform confirmation, "2" to perform registration, or "3" to cancel the operation. In step S13, the CPU 31 checks the key pressed in step S12. If "1" is found in step S13, the CPU 31 executes the confirmation in step S14. If "2" is found in step S13, the CPU 31 executes the registration in step S15. If "3" is found in step S13, the CPU 31 returns the flow to step S1. The confirmation and the registration in steps S14 and S15 will be described in more detail later with reference to FIGS. 11 and 12, respectively.

Figure 7:
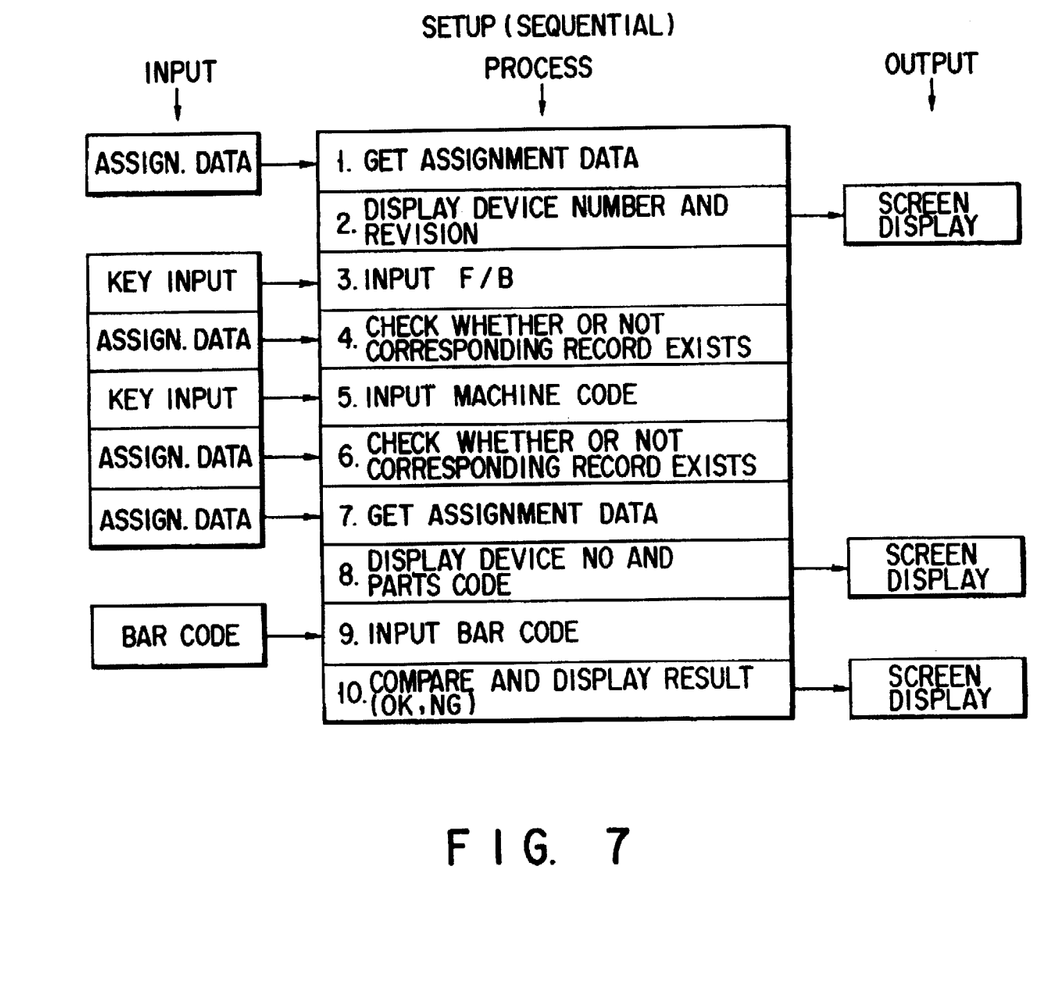
FIG. 7 is a view showing the contents of setup processing based on the device number order shown in FIG. 6.

FIG. 7 is a view showing the contents of the setup processing (step S7) based on the device number order shown in FIG. 6. The setup processing is executed when "setup" is chosen from the main menu by the operation of the numerical key "1" and "device number order" is chosen from the setup menu by the operation of the numerical key "1".

In process 1 of FIG. 7, assignment data based on the device number and revision (version) already designated in the process of fetching device data including the assignment data is read out as an object to be processed in the work area of the memory 33. In process 2, the device number and revision already designated are displayed on the display 35. In process 3, the parts mounting surface (forward surface/ backward surface) of a PCB (Printed Circuit Board) onto which parts are to be mounted is designated from the keyboard 34. In process 4, the CPU 31 checks whether assignment data corresponding to the designation exists in the memory 33. If no corresponding data exists, the CPU 31 instructs an operator to perform reentry. In process 5, the machine number (machine code) of the parts mounter 50 is input from the keyboard 34. In process 6, the CPU 31 checks whether assignment data corresponding to the designation exists in the memory 33. If no corresponding data exists, the CPU 31 instructs the operator to perform reentry.

In processes 7 and 8, the corresponding assignment data is read out in units of parts in the order of device numbers, and the device numbers and the parts codes are displayed on the display 35.

In process 9, with the cartridges 10 set in the parts mounter 50, the parts supply reels 21 corresponding to the displayed device numbers are manually lifted up in the order of device numbers (D1, D2, . . . ) The bar code reader 32 reads the parts code recorded on the label 23 adhered on each parts supply reel 21.

In process 10, the CPU 31 compares the parts code read by the bar code reader with the assignment data. If the parts code read by the bar code reader 32 agrees with the displayed parts code mentioned above, the CPU 31 causes the display 35 to display "OK" and the alarm unit 37 to generate an audible tone of 400 Hz (f1), informing the operator that the parts code read by the bar code reader 32 is in agreement with the displayed parts code (i.e., informing that the correct parts supply reel 21 is attached to the position of the displayed device number). If the parts code read by the bar code reader 32 disagrees with the displayed parts code, the CPU 31 causes the display 35 to display "NG" and the alarm unit 37 to generate an audible tone of 800 Hz (f2), informing the operator of the disagreement between the parts code read by the bar code reader 32 and the displayed parts code.

Figure 8:
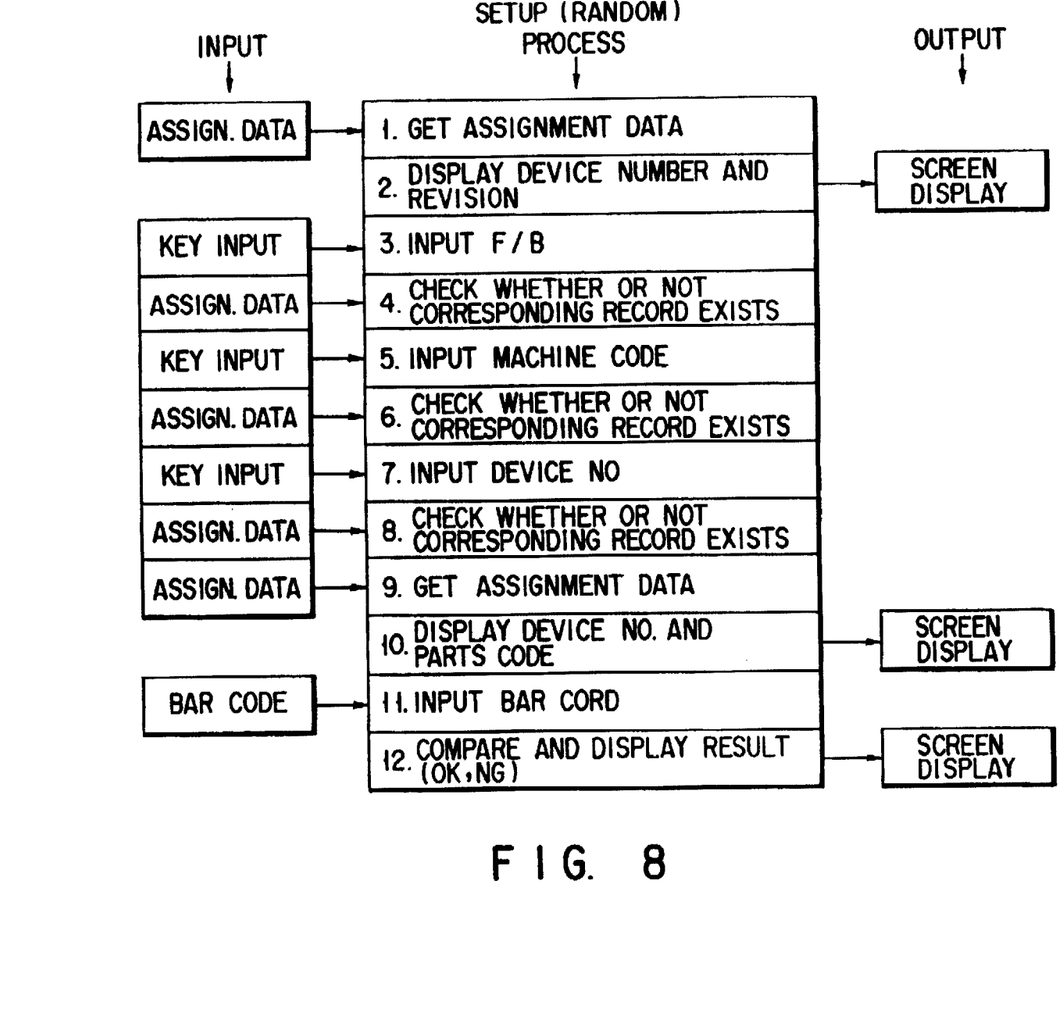
FIG. 8 is a view showing the contents of random setup shown in FIG. 6.

FIG. 8 is a view showing the contents of the random setup (step S8) not corresponding to the device number order shown in FIG. 6. This random setup is executed when "setup" is selected from the main menu by the operation of the numerical key "1" and "random" is selected from the setup menu by the operation of the numerical key "2".

The procedure shown in FIG. 8 is almost identical with that shown in FIG. 7 except that the device numbers are input from the keyboard 34 in process 7, so a detailed description of each process will be omitted.

Figure 9:
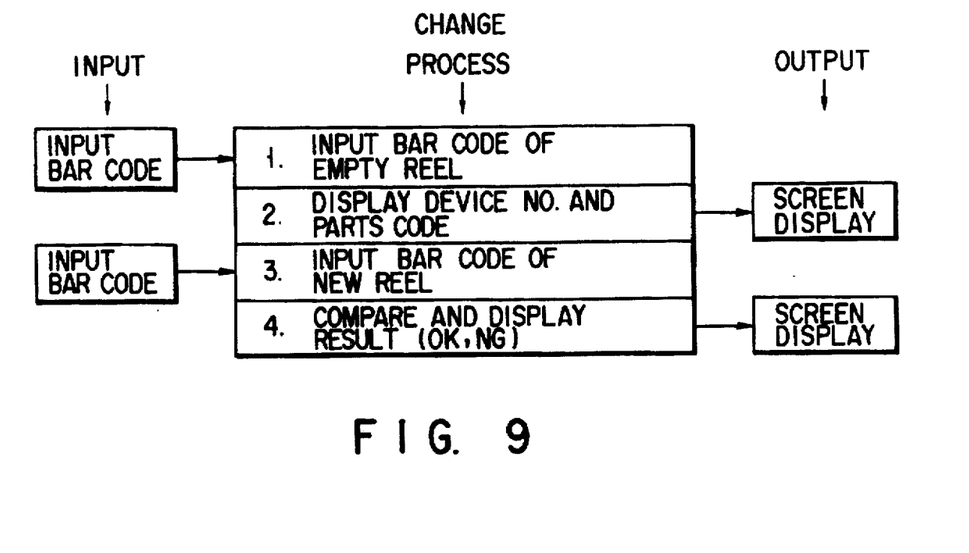
FIG. 9 is a view showing the contents of parts change (change) shown in FIG. 6.

FIG. 9 is a view showing the contents of the parts change (step S9) illustrated in FIG. 6. The parts change is executed when "change" is chosen from the main menu by the operation of the numerical key "2". This processing is executed in order to check whether correct parts are changed in changing of the parts. More specifically, the processing is executed in reel change which is performed when a parts supply reel 21 becomes empty.

In process 1 of FIG. 9, an operator causes the bar code reader 32 to read the bar code of an empty reel. In process 2, the CPU 31 causes the display 35 to display the device number and the parts code corresponding to the input bar code of the reel. In process 3, the operator makes the bar code reader 32 read the bar code of a new reel. In process 4, the CPU 31 compares the bar code input in process 3 with the bar code input in process 1. If the two bar codes are consistent with each other, the CPU 31 displays "OK" on the display 35. If the two bar codes are not consistent with each other, the CPU 31 displays "NG" on the display 35.

Figure 10:
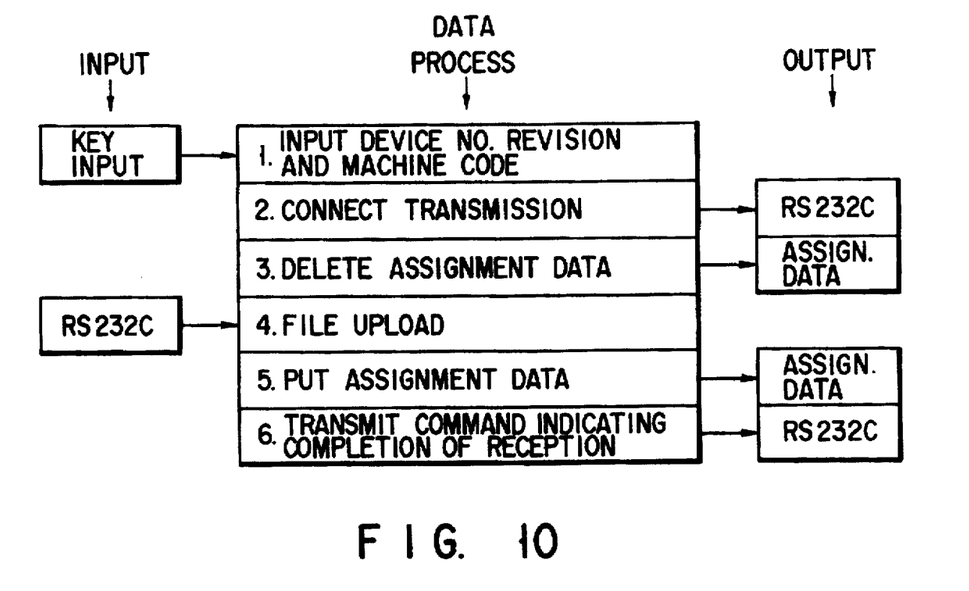
FIG. 10 is a view showing the contents of data fetch shown in FIG. 6.

FIG. 10 is a view showing the contents of the data fetch (step S10) illustrated in FIG. 6. This data fetch is executed when "data" is chosen from the main menu by the operation of the numerical key "3". By the execution of this data fetch, device data including assignment data corresponding to the designated device number and revision (version) is transferred from the system managing computer 40 to the handheld terminal 30 and stored in the data storage area of the memory 33.

In process 1 of FIG. 10, an operator inputs a device number, a revision, and a machine code (which indicates the parts mounter corresponding to that code). In process 2, the CPU 31 sends a "connect" command to the system managing computer 40 via the communication controller 36 of an RS232C specification and also transmits the input device number and revision. In process 3, the CPU 31 deletes assignment data which is assigned to the memory 33. In process 4, the CPU 31 receives the file of device data including assignment data supplied from the system managing computer 40 via the communication controller 36. In process 5, the CPU 31 stores the received assignment data in an area labeled "ASSIN. DATA" of the memory 33. In process 6, an operator inputs a reception completion command from the keyboard, and the CPU 31 transmits the input command to the system managing computer 40.

Figure 11:
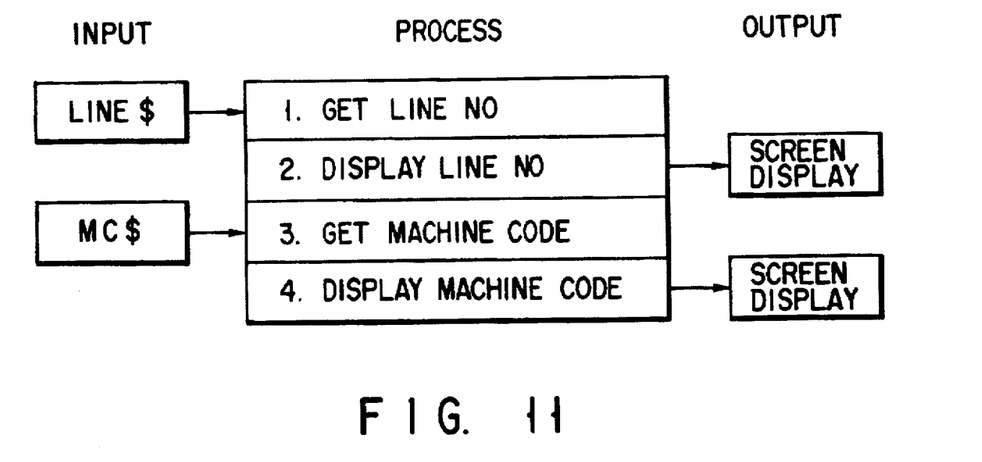
FIG. 11 is a view showing the contents of line confirmation shown in FIG. 6.

FIG. 11 is a view showing the contents of the line confirmation (step S14) shown in FIG. 6. The line confirmation is executed when "line" is selected from the main menu by the operation of the numerical key "4" and "confirmation" is chosen from the line menu by the operation of the numerical key "1".

This line confirmation is chosen and executed to confirm the line arrangement.

In process 1 of FIG. 11, the CPU 31 reads out a line number from an area labeled "LINE$" of the memory 33. In process 2, the CPU 31 displays the readout line number on the display 35. In process 3, the CPU 31 reads out a registered machine code from an area labeled "MC$" of the memory 33. In process 4, the CPU 31 displays the readout machine code on the display 35.

Figure 12:
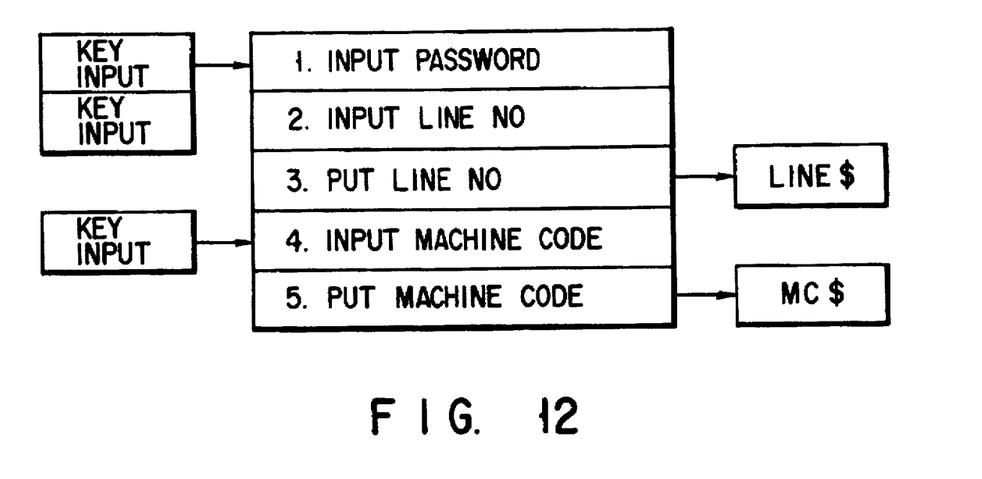
FIG. 12 is a view showing the contents of line registration shown in FIG. 6.

FIG. 12 is a view showing the contents of the line registration (step S15) illustrated in FIG. 6. The line registration is executed when "line" is selected from the main menu by the operation of the numerical key "4" and "registration" is selected from the line menu by the operation of the numerical key "2".

This line registration is chosen and executed when, e.g., the line arrangement is changed.

In process 1, an operator inputs a password from the keyboard 34. If the input password is in agreement with the registered password, the next data input is enabled. In process 2, the operator inputs a line number from the keyboard 34. In process 3, the CPU 31 registers the input line number in the area "LINE$" of the memory 33. In process 4, the operator inputs a machine code from the keyboard 34 or by causing the bar code reader 32 to read the bar code adhered on the machine (parts mounter) and indicating the machine code. In process 5, the CPU 31 registers the input machine code in the area "MC$" of the memory 33.

The operation of the embodiment of the present invention will be described below with reference to the drawings mentioned above.

The cartridges 10 each having the reel lifting mechanism as shown in FIGS. 2 and 3 are set in the parts mounter 50.

The parts supply reel 21 on which the parts mounting tape 22 holding the parts to be mounted P at fixed intervals is wound is attached to the reel support member 12 of each cartridge 10. The label 23 on which the parts code of parts to be mounted is recorded in the form of a bar code is adhered on one side surface of each parts supply reel 21.

To read the parts code of the parts supply reel 21 attached to one of the cartridges 10 set in the parts mounter 50, the reel support member 12 is pivoted by an operator from the set position PA to the bar code read position PB by pinching the pinching portion 12a which is provided to the reel support member 12 of the cartridge 10 to perform the reel lifting operation. Consequently, as shown in FIG. 3, only the parts supply reel 21 attached to the reel support member 12 of the cartridge 10 that is pivoted projects upward more than other reels. This allows the hand-held terminal 30 to readily read the bar code of the label 23 adhered on the side surface of the parts supply reel 21. By repeatedly performing the reel lifting operation and the bar code read operation using the hand-held terminal 30, it is possible to read the parts codes of the parts supply reels 21 attached to the cartridges 10 with the cartridges 10 kept placed in the parts mounter 50.

The processing activities for checking the parts assignment of the parts mounter 50 in which the cartridges 10 each having the reel lifting mechanism are set will be described below with reference to FIGS. 6 through 12.

This parts assignment check is done by using the handheld terminal 30. Assume, for simplicity, that the assignment data for the parts mounter 50 to be subjected to the parts assignment check is already transferred from the system managing computer 40 to the memory 33 of the handy terminal 30 following the procedure shown in FIG. 10.

The setup processing based on the device number order as illustrated in FIG. 7 is executed when "setup" is selected from the main menu displayed on the display 35 by the operation of the numerical key "1" of the keyboard 34 and "device number order" is chosen from the setup menu by the operation of the numerical key "1" (steps S1 through S7 in FIG. 6).

In this processing, assignment data based on the device number and revision (version) already designated in the process of fetching device data including the assignment data is fetched as an object to be processed in the work area of the memory 33, and the designated device number and revision are displayed on the display 35 (processes 1 and 2). In addition, the parts mounting surface (forward surface/ backward surface) of a PCB (Printed Circuit Board) onto which parts are to be mounted is input from the keyboard 34; the machine code is input; and the assignment data to be checked is specified, thereby enabling the parts check work based on the order of the device numbers (D1, D2, . . . ) (processes 3 through 7).

Consequently, in accordance with the corresponding assignment data, the device numbers and the parts codes are displayed on the display 35 in units of parts in the order of device numbers (process 8).

In accordance with the displayed contents, an operator lifts up the parts supply reel 21 corresponding to the displayed device number with the cartridges 10 placed in the parts mounter 50, and makes the bar code reader 32 read the parts code recorded on the label 23 adhered on that parts supply reel 21 (process 9).

The parts code read by the bar code reader 32 is compared with the assignment data, thereby checking whether the correct parts supply reel 21 is attached to the position of the displayed device number. The operator is informed of the check result by the display and the sound (process 10). That is, if the parts code read by the bar code reader 32 agrees with the displayed parts code, the display 35 displays "OK", and the alarm unit 37 generates an audible tone of 400 Hz (f1), informing the operator that the parts code read by the bar code reader 32 is in agreement with the displayed parts code (i.e., informing that the correct parts supply reel 21 is attached to the position of the displayed device number). If the parts code read by the bar code reader 32 disagrees with the displayed parts code, the display 35 displays "NG", and the alarm unit 37 generates an audible tone of 800 Hz (f2), informing the operator of the disagreement between the parts code read by the bar code reader 32 and the displayed parts code.

If it is confirmed that the correct parts supply reel 21 is attached to the position of the displayed device number, the next device number and parts code are displayed on the display 35; the parts supply reel 21 corresponding to the displayed device number is lifted up; and the parts code recorded on the label 23 adhered on the parts supply reel 21 is read by the bar code reader 32, thereby repeatedly executing the parts error check (OK/NG determination) in the same fashion as discussed above (processes 8 through 10).

This parts error check using the hand-held terminal 30 permits a single operator to rapidly, readily, and reliably perform the work of confirming the parts set in the parts mounter 50.

Note that in the case of the random parts check not based on the device number order, parts confirmation similar to the above processing is executed following the procedure shown in FIG. 8. This processing is nearly identical with that illustrated in FIG. 7 except that the device numbers are input from the keyboard 34, so a detailed description thereof will be omitted.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A managing system for a parts mounter, comprising:

a plurality of cartridges each having a parts supply reel, on one side surface of which a parts code label is adhered, arranged parallel to each other at narrow intervals, each of said cartridges including:

a cartridge main body;

a reel support member having a portion for attaching a parts supply reel; and connecting means connecting the cartridge main body with the reel support member for allowing said reel support member to be supported by said cartridge main body so that said reel support member can be pivoted upward at a predetermined pivoting angle, while said cartridge main body is kept placed in said parts mounter;

a host computer;

a hand-held terminal including:

storage means for storing parts assignment data of said parts mounter;

a reader for reading a parts code of a label adhered on one side surface of said parts supply reel;

parts checking means for checking validity by comparing the parts code read by said reader with parts assignment data stored in said storage means;

output means for outputting the result of the parts check; and means connected to the host computer for receiving, from said host computer, parts assignment data in which device numbers indicating cartridge mounting positions are listed in a one-to-one correspondence with parts codes to be compared with the parts code of the label adhered on one said surface of said reel, and storing the received parts assignment data in said storage means.

2. A system according to claim 1, wherein said output means for outputting the result of the parts check comprises display means and audible tone generating means.

3. A system according to claim 1, wherein said parts checking means comprises means for performing the parts check in an order of arrangement of said cartridges, and means for performing the parts check independent of the order of arrangement of said cartridges.

4. A system according to claim 1, wherein said hand-held terminal comprises means for performing cartridge setup processing in accordance with a device number order and cartridge setup processing independent of the device number order, means for checking whether a correct parts change is performed in changing of parts, means for confirming which parts mounters are linked in which order in each line, and means for performing registration for said parts mounters in each line.

5. A managing system for a parts mounter, comprising:

a plurality of cartridges each having a parts supply reel, on one side surface of which a parts code label is adhered, arranged parallel to each other at narrow intervals, each of said cartridges including:

a cartridge main body;

a reel support member having a portion for attaching a parts supply reel; and connecting means connecting the cartridge main body with the reel support member for allowing said reel support member to be supported by said cartridge main body so that said reel support member can be pivoted upward at a predetermined pivoting angle, while said cartridge main body is kept placed in said parts mounter;

a host computer;

a hand-held terminal including:

storage means for storing parts assignment data of said parts mounter;

a reader for reading a parts code of a label adhered on one side surface of said parts supply reel;

parts checking means for checking validity by comparing the parts code read by said reader with parts assignment data stored in said storage means;

output means for outputting the result of the parts check;

means connected to the host computer for receiving, from said host computer, parts assignment data in which device numbers indicating cartridge mounting positions are listed in a one-to-one correspondence with parts codes to be compared with the parts code of the label adhered on one said surface of said reel, and storing the received parts assignment data in said storage means;

means for performing cartridge setup processing in accordance with a device number order and cartridge setup processing regardless of the device number order and, means for checking whether a correct parts change is performed when changing parts;

means for confirming which parts mounters are linked in which order in each line; and means for performing registration for said parts mounters in each line.

* * * * *